(12) United States Patent
Mori et al.

(10) Patent No.: US 9,121,548 B2
(45) Date of Patent: Sep. 1, 2015

(54) SLIDING MEMBER

(75) Inventors: Hiroyuki Mori, Nisshin (JP); Munehisa Matsui, Toyota (JP); Keiji Hayashi, Nagoya (JP); Yoshio Fuwa, Toyota (JP); Takatoshi Shinyoshi, Toyota (JP); Satoshi Jinno, Toyota (JP); Kenji Shimoda, Nagoya (JP); Satoshi Hirota, Takasago (JP); Koichiro Akari, Takasago (JP); Hirotaka Ito, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/110,782

(22) PCT Filed: Apr. 12, 2012

(86) PCT No.: PCT/JP2012/002529
§ 371 (c)(1),
(2), (4) Date: Oct. 9, 2013

(87) PCT Pub. No.: WO2012/140890
PCT Pub. Date: Oct. 18, 2012

(65) Prior Publication Data
US 2014/0038868 A1    Feb. 6, 2014

(30) Foreign Application Priority Data

Apr. 15, 2011 (JP) ................................. 2011-091450

(51) Int. Cl.
*C23C 14/32* (2006.01)
*F16N 1/00* (2006.01)
(Continued)

(52) U.S. Cl.
CPC ............... *F16N 1/00* (2013.01); *C10M 135/32* (2013.01); *C23C 14/0635* (2013.01); *C23C 14/3492* (2013.01); *C23C 14/352* (2013.01); *C23C 14/505* (2013.01); *C23C 28/042* (2013.01); *C23C 28/044* (2013.01); *C23C 28/42* (2013.01);
(Continued)

(58) Field of Classification Search
USPC ...................... 428/336, 408, 457, 698, 704
See application file for complete search history.

(56) References Cited

U.S. PATENT DOCUMENTS 7,939,172 B2 * 5/2011 Gorokhovsky et al. ........ 428/408
8,293,359 B2 * 10/2012 Kathrein ....................... 428/698
(Continued)

FOREIGN PATENT DOCUMENTS

JP     10 237627         9/1998
JP     11-100671 A       4/1999
(Continued)

OTHER PUBLICATIONS

Lin et al "Processing, Structure, and Propoerties of Nanostructured Multifunctional Tribological Coatings" Nanoscience & Nanotechnology vol. 9, (2009) p. 4073-4084.*
(Continued)

*Primary Examiner* — Archene Turner
(74) *Attorney, Agent, or Firm* — Oblon, McClelland, Maier & Neustadt, L.L.P.

(57) ABSTRACT

A sliding member includes: a substrate which has a sliding surface sliding under the presence of lubricating oil; and a film which is fixed to at least a part of the sliding surface. The film contains carbon (C), titanium (Ti), and boron (B), is obtained by repeatedly and alternately layering a first layer containing amorphous carbon as a principal component and a second layer containing C and Ti as principal components, and has hardness of 18 GPa or more.

7 Claims, 8 Drawing Sheets

(51) Int. Cl.
| | |
|---|---|
| *F02F 3/10* | (2006.01) |
| *C23C 14/06* | (2006.01) |
| *C10M 135/32* | (2006.01) |
| *C23C 14/34* | (2006.01) |
| *C23C 14/35* | (2006.01) |
| *C23C 14/50* | (2006.01) |
| *C23C 28/04* | (2006.01) |
| *C23C 28/00* | (2006.01) |

(52) U.S. Cl.
CPC ............... *F02F 3/10* (2013.01); *Y10T 428/265* (2015.01); *Y10T 428/31678* (2015.04)

(56) References Cited

U.S. PATENT DOCUMENTS

| | | | |
|---|---|---|---|
| 2001/0031346 A1 | 10/2001 | Iwamura | |
| 2003/0162672 A1* | 8/2003 | Shirahama et al. | 508/291 |
| 2004/0209125 A1* | 10/2004 | Yamamoto et al. | 428/698 |
| 2007/0284255 A1 | 12/2007 | Gorokhovsky et al. | |
| 2010/0119315 A1 | 5/2010 | Kathrein | |

FOREIGN PATENT DOCUMENTS

| | | |
|---|---|---|
| JP | 2001 261318 | 9/2001 |
| JP | 2002 38255 | 2/2002 |
| JP | 2002 322555 | 11/2002 |
| JP | 2003 145316 | 5/2003 |
| JP | 2007 222995 | 9/2007 |
| JP | 2008 81630 | 4/2008 |
| JP | 2009 34781 | 2/2009 |
| JP | 2010 111952 | 5/2010 |

OTHER PUBLICATIONS

Stuber et al "Microstructure and properties of low friction tiC-C nanocomposite coatings deposited by amgnetron sputtering" Surface & Coatings Tech, 150 (200) p. 218-226.*

Written Opinion of the International Searching Authority Issued Jun. 12, 2012 in PCT/JP12/002529 Filed Apr. 12, 2012.

International Search Report Issued Jun. 12, 2012 in PCT/JP12/002529 Filed Apr. 12, 2012.

* cited by examiner

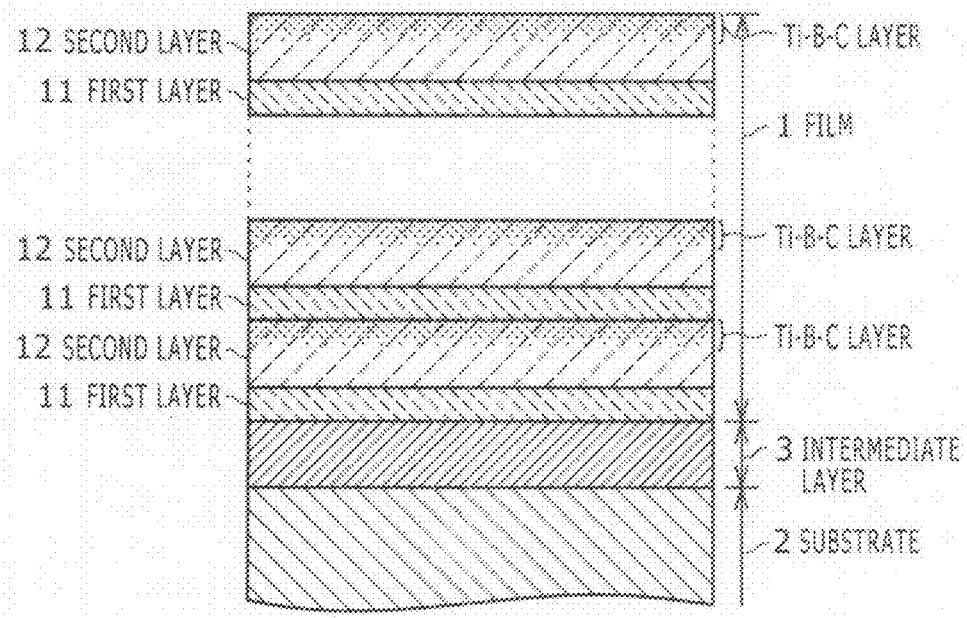
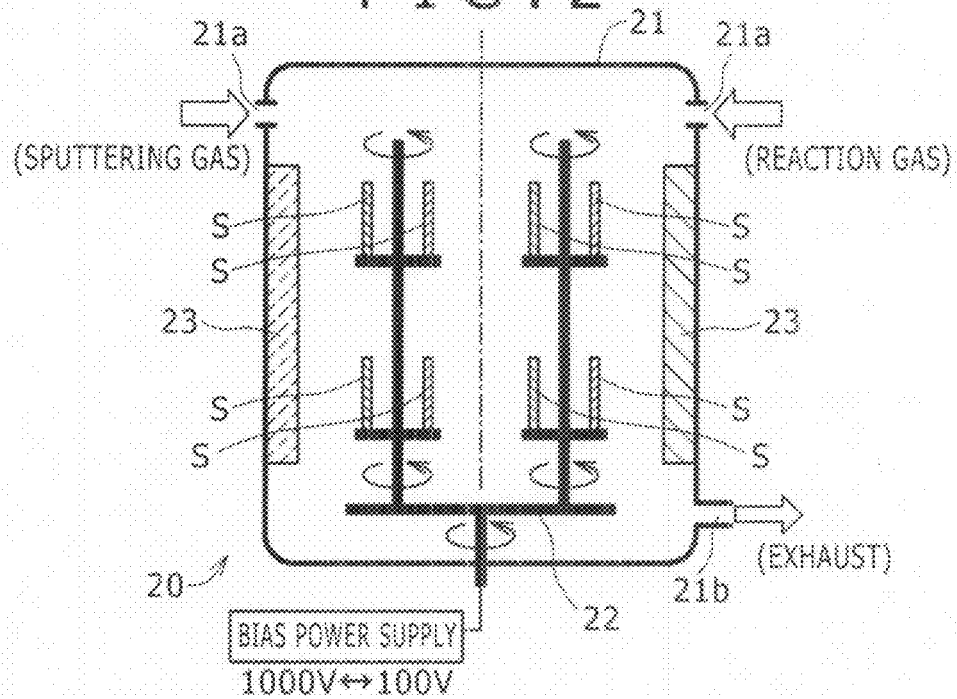

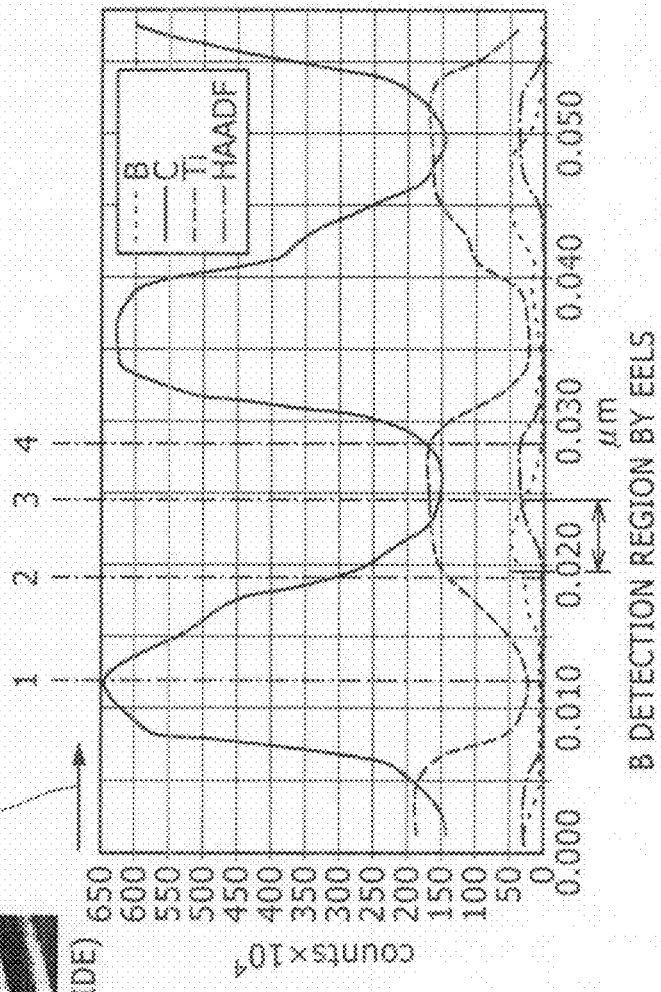
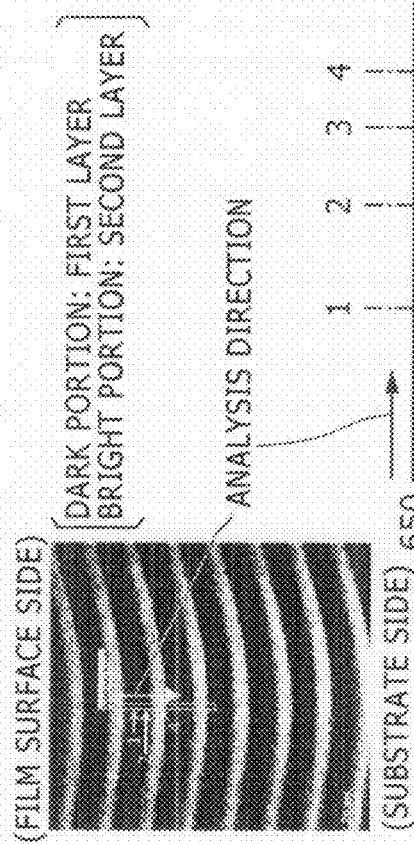
FIG. 8

FIG. 11
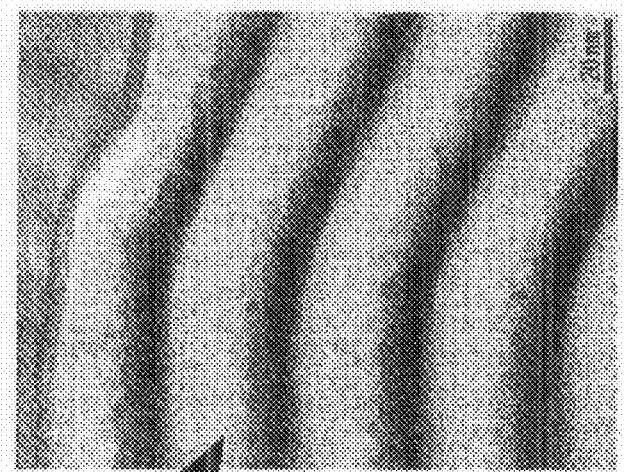
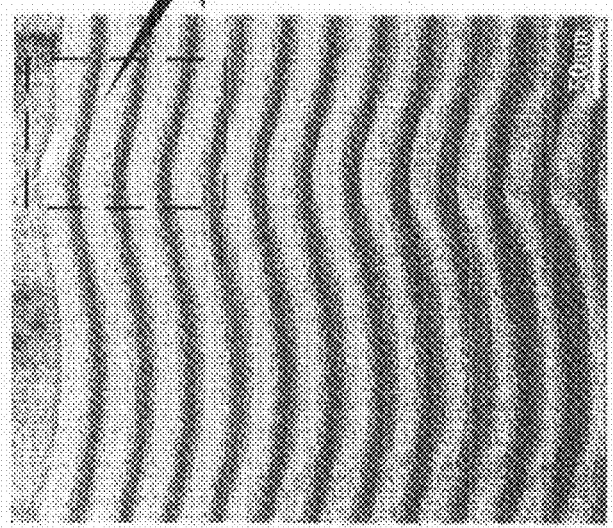
BRIGHT PORTION: FIRST LAYER
DARK PORTION: SECOND LAYER
COMPARATIVE EXAMPLE 4

SLIDING MEMBER

TECHNICAL FIELD

The present invention relates to a sliding member that is mainly used under a wet condition using lubricating oil.

BACKGROUND ART

From the viewpoint of environmental problems and resource conservation, there is a demand for a reduction in energy loss due to a friction in a sliding member such as a valve system component and a piston constituting an engine. For this reason, various surface treatments have been performed on a sliding surface of the sliding member in order to reduce the frictional coefficient of the sliding member and to improve the wear resistance thereof. Among these, an amorphous hard carbon film called a diamond-like carbon (DLC) film is widely used as a film that improves the slidability of the sliding surface.

In order to improve the original characteristics of the DLC film and adopt other characteristics, for example, the DLC film is added with a metal component or is formed to be layered with a film having other characteristics. As the cited documents for the layering of the DLC film, Patent Documents 1 to 5 may be exemplified. Patent Documents 1 to 5 all disclose a coating film having low friction and excellent wear resistance. All the coating films have a layered structure. For example, the layered structure is formed by layering a DLC film having different characteristics, layering a DLC film added with other components, or layering a DLC film and another compound film.

For example, Patent Document 1 discloses a coating layer obtained by repeatedly and alternately layering a hard carbon film added with at least one kind of metal component along with at least one kind of metal, metal carbide, metal nitride, or metal carbonitride. Specifically, a layered film may be obtained by alternately layering a hard carbon film added with boron and a hard carbon film added with silicon, a layered film may be obtained by alternately layering titanium carbonitride and a hard carbon film, and a layered film may be obtained by alternately layering a hard carbon film added with tungsten and a hard carbon film added with boron. In Patent Document 1, since a sliding action is supposed under the non-lubricant environment in which lubricating oil is not used, it is considered that lubricating oil is not used in a wear test for a sample including such a layered film. The interaction between the component contained in the layered film and the component contained in the lubricating oil largely influences the frictional wear characteristics, but in Patent Document 1, such an interaction is not considered at all.

In addition, Patent Documents 2, 3, and 5 also disclose a layered film, but even in such cited documents, an evaluation in lubricating oil was not performed. Meanwhile, in Patent Document 4, a sliding test is performed by using lubricant containing molybdenum dialkyldithiocarbamate (Mo-DTC). However, the film included in the sliding member disclosed in Patent Document 4 is a DLC multi-layered film which contains carbon and hydrogen, and essentially does not contain other components. For this reason, the interaction between the component added to the film and the component contained in the lubricating oil is not considered.

Further, in order to reduce the frictional coefficient of the existing sliding member including the DLC film containing the metal component, a use in lubricating oil containing molybdenum added with Mo-DTC and the like is assumed in many cases. However, in the sliding action in the lubricating oil containing molybdenum, the oxidational wear of the DLC film occurs, and hence the wear is promoted compared to the sliding action in lubricating oil that does not contain molybdenum or the sliding action in an environment without lubricant. Further, there is a concern that the use of the lubricating oil containing the heavy-metal molybdenum may cause environmental problems. For this reason, there is a demand for a sliding member that exhibits a low frictional coefficient in lubricating oil without molybdenum.

CITATION LIST

Patent Document

Patent Document 1: JP 10-237627 A
Patent Document 2: JP 2001-261318 A
Patent Document 3: JP 2002-322555 A
Patent Document 4: JP 2008-81630 A
Patent Document 5: JP 2002-38255 A

SUMMARY OF INVENTION

It is an object of the present invention to provide a novel sliding member that exhibits low friction and high wear resistance in lubricating oil.

The present inventors have conducted a study on a sliding member including a DLC film (Ti-DLC film) added with titanium, and got to know a remarkable fact that a frictional coefficient decreases and wear increases due to a sliding action in lubricating oil containing molybdenum. Therefore, in a process of forming a Ti-DLC film, there has been an attempt to improve wear resistance by improving the hardness of the film in a manner such that titanium carbide (TiC) as a hard compound is actively formed. Meanwhile, the present invention to be described later is contrived by solving various problems caused by the presence of TiC.

That is, there is provided a sliding member including: a substrate which has a sliding surface sliding under the presence of lubricating oil and a film which is fixed to at least a part of the sliding surface, wherein the film contains carbon (C), titanium (Ti), and boron (B), is obtained by repeatedly and alternately layering a first layer containing amorphous carbon as a principal component and a second layer containing C and Ti as principal components, and has hardness of 18 GPa or more.

Furthermore, as the hardness of the film, a measurement value obtained by Nano-Indenter using MTS manufactured by TOYO Corporation and Tribo scope manufactured by Hysitron, Inc. is adopted.

The sliding member of the present invention includes a film obtained by alternately layering a first layer containing amorphous carbon as a principal component and a second layer containing C and Ti as principal components. Since C and Ti as the principal components of the second layer form hard carbide (TiC), the hardness of the film is improved. Since the second layer is layered along with the first layer containing amorphous carbon as a principal component, the first layer supplements the friction reduction effect which is not sufficiently obtained only by the second layer. Further, since the film contains B, the adhesiveness between the first layer and the second layer is improved, and the toughness of the film is improved. Thus, the wear resistance is improved.

The sliding member of the present invention exhibits low friction and high wear resistance under a wet condition using lubricating oil.

BRIEF DESCRIPTION OF DRAWINGS

FIG. 1 is a cross-sectional view schematically illustrating a sliding member of the present invention.

FIG. 2 is a schematic diagram illustrating an example of a film forming device which forms a film provided in the sliding member of the present invention.

FIG. 8 illustrates a HAADF image according to a HAADF-STEM method and a concentration profile based on a TEM-EDX analysis in the film provided in the sliding member of the present invention.

FIG. 11 illustrates a cross-section observation result of a film provided in a sliding member corresponding to Comparative Example of the present invention.

DESCRIPTION OF EMBODIMENTS

Figure 3:
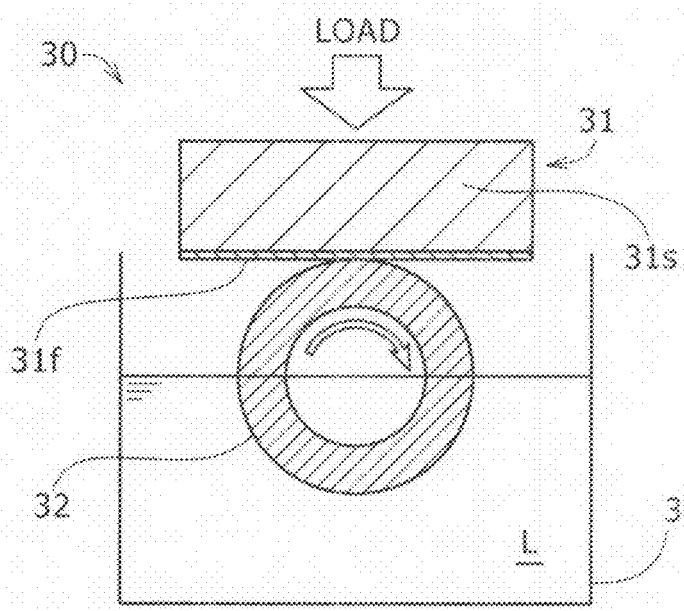
FIG. 3 is a schematic diagram illustrating a ring-on-block type friction testing machine.
Figure 4:
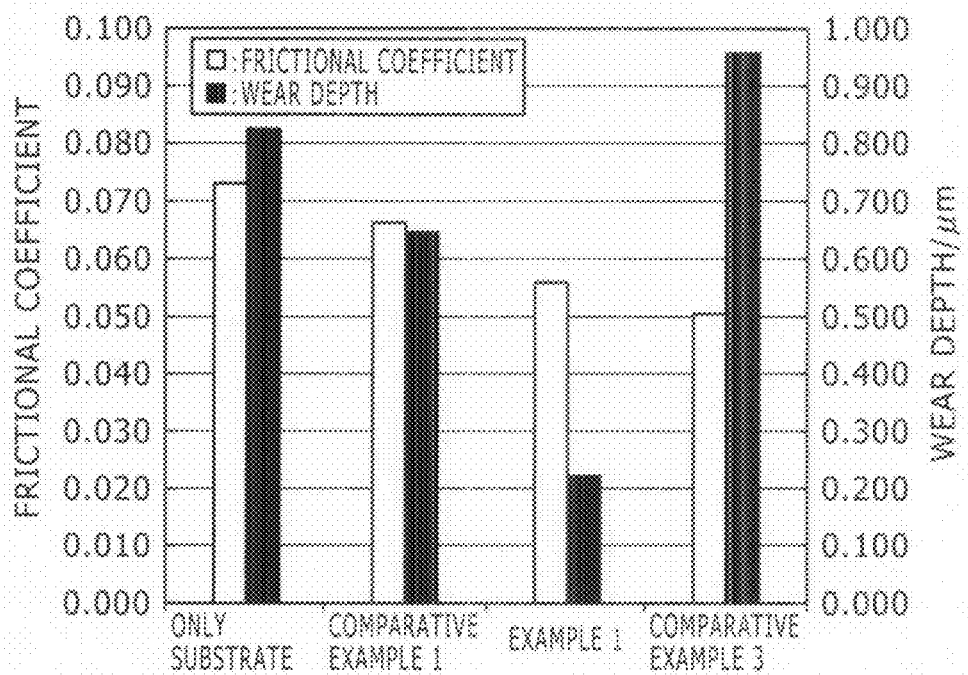
FIG. 4 is a graph illustrating a result of a friction test and illustrates frictional coefficients and wear depths of various sliding members.

Hereinafter, a preferred embodiment of a sliding member of the present invention will be described. Furthermore, unless it is explicitly stated otherwise, the numerical value range of "x to y" described in the present specification includes the lower limit x and the upper limit y. Then, the upper-limit value, the lower-limit value, and the numerical values mentioned in the embodiment may be included in the numerical value range and these values may be arbitrarily combined with one another to obtain the numerical value range.

A sliding member of the present invention includes a substrate which includes a sliding surface causing a sliding action under the presence of lubricating oil and a film which is fixed to at least a part of the sliding surface. Hereinafter, the substrate, the film, and the lubricating oil will be described.

<Substrate>

The material of the substrate is not particularly limited as long as the material may be used as the sliding member. A material selected from metal, ceramics, and resin may be used. For example, a metal substrate such as carbon steel, alloy steel, cast iron, aluminum alloy, and titanium alloy, a ceramics substrate such as supersteel, alumina, and silicon nitride, and a resin substrate such as polyimide and polyamide may be exemplified.

It is desirable that the surface roughness of the substrate be equal to or smaller than 0.1 μm, 0.04 μm, and 0.01 μm as the arithmetic mean roughness (Ra) specified by JIS B 0031 (1994) on the surface provided with at least the film. Further, from the viewpoint of the adhesiveness between the substrate and the film, the surface to which the film is fixed in the substrate may undergo a treatment such as a nitriding treatment, a fine unevenness forming treatment, and an intermediate layer forming treatment in response to the material of the substrate. The type of the intermediate layer is not particularly limited. For example, a chrome layer, a titanium layer, a tungsten layer, a chrome compound layer, a titanium compound layer, a tungsten compound layer, and a complex compound layer containing two kinds or more from chrome, titanium, and tungsten may be exemplified. The structure of the intermediate layer may be a single-layered structure or a layered structure. In a case of the single-layered structure in which the intermediate layer is formed by the compound, the structure may be a single composition layer of which the composition is constant at any position in the thickness direction and a gradient composition layer of which the composition gradually changes in the thickness direction. In a case where the intermediate layer is a layered structure, the thicknesses and/or the compositions of the respective layered layers may be different from one another, and the composition may be changed in the thickness direction by changing the thicknesses and/or the compositions of the respective layers.

Furthermore, as a counter material on which the film slides, metal such as carbon steel, alloy steel, cast iron, aluminum alloy, and titanium alloy, ceramics such as cemented carbide, alumina, and silicon nitride, and resin such as polyimide and polyamide are appropriate. Further, when the surface of the counter material is also provided with a DLC film of the related art or a film to be specifically described later, the frictional coefficient may be further satisfactorily reduced.

<Structure of Film>

The film has a structure obtained by repeatedly and alternately layering a first layer and a second layer. The structure of the film will be described by referring to FIG. 1. FIG. 1 is a cross-sectional view schematically illustrating a sliding member of the present invention. As described above, a sliding member 10 includes a substrate 2 which has a sliding surface, a film 1 which is fixed to at least a part of the sliding surface, and an intermediate layer 3 which is positioned between the film 1 and the substrate 2 if necessary. The film contains carbon (C), titanium (Ti), and boron (B).

The film 1 has a structure in which a first layer 11 and a second layer 12 are repeatedly and alternately layered. The first layer 11 contains amorphous carbon as a principal component, and the second layer 12 contains C and Ti as principal components. For this reason, C is contained in the entire film 1, but Ti and B may not be contained in the entire film 1. Ti may be contained in at least the second layer 12 and exists as titanium carbide (TiC) in the second layer. TiC is desirably a nano-order fine crystal and may evenly exist in the second layer 12. At this time, it is desirable to form the matrix of the second layer 12 by amorphous carbon. B is a component which improves the adhesiveness between the first layer and the second layer which are layered on each other. For this reason, it is desirable that B exist in at least the vicinity of the boundary face between the first layer and the second layer. Specifically, it is desirable that the second layer contain C, Ti, and B, and at least one surface layer of the second layer (that is, at least one side of the boundary face portion between the first layer and the second layer in the second layer) may have a Ti—B—C layer of which the B content is higher than those of the other portions.

The thicknesses of the first layer and the second layer are not particularly limited, but it is desirable that the ratio (T=T1/T2) of the thickness T1 of the first layer with respect to the thickness T2 of the second layer be equal to or larger than 0.3 and equal to or smaller than 2. The more desirable value of T is equal to or larger than 0.4 and 0.5 and equal to or smaller than 1.5 and 1. When T is equal to or larger than 0.3, it is desirable in that the friction reduction effect may be satisfactorily obtained by the first layer. When T is equal to or smaller than 2, it is desirable in that the wear resistance improvement effect may be satisfactorily obtained by the second layer. Further, the thickness of the layered portion formed by a pair of the first layer and the second layer may be 10 to 60 nm, 15 to 45 nm, and 20 to 30 nm. It is desirable that the thickness of the Ti—B—C layer in T2 be 1 to 10 nm and 4 to 6 nm. When the thickness of the Ti—B—C layer is equal to or larger than 1 nm, it is desirable in that the film toughness improvement effect may be satisfactorily obtained. Meanwhile, even when the Ti—B—C layer with the thickness larger than 10 nm is formed, it is hard to largely improve the adhesiveness between the first layer and the second layer and it is difficult to form the thick Ti—B—C layer from the technical viewpoint. Furthermore, a method of measuring the thickness of the Ti—B—C layer will be described in Example.

It is desirable to obtain the film by layering the first layers and the second layers as many as 10 to 1000 layers in total. Further, it is desirable that the film be thick from the viewpoint of the durability, but the thickness may be 0.5 to 7 μm and 1 to 5 μm.

Furthermore, the terms of the "first layer" and the "second layer" are merely used to distinguish two layers. For this reason, the sequence of layering the layers on the substrate is not particularly limited, and the film may be formed from the second layer. However, from the viewpoint of the adhesiveness with respect to the intermediate layer, it is desirable to first form the first layer on the surface of the substrate or the intermediate layer as shown in FIG. 1. Further, the film formation may end at the first layer or the second layer. However, from the viewpoint of the frictional wear characteristics, it is desirable to form the second layer on the outermost surface as shown in FIG. 1.

It is desirable that the surface roughness of the film be equal to or smaller than 0.1 μm, 0.07 μm, and 0.04 μm as the arithmetic mean roughness (Ra) specified by JIS B 0031 (1994). When Ra exceeds 1 μm, it is hard to expect an increase in lubrication ratio by lubricating oil and it is difficult to reduce the frictional coefficient.

The hardness of the film is equal to or larger than 18 GPa. Desirably, the hardness is equal to or larger than 19 GPa and 20 GPa. However, when the film is too hard, the cracking and the peeling of the film occur. It is desirable that the upper limit of the hardness of the film be equal to or smaller than 50 GPa, 40 GPa, and 35 GPa.

<Composition of Film>

When the entire film is assumed as 100 at %, the film may contain Ti of 6 at % to 40 at % and B of 2 at % to 30 at %.

Ti forms TiC along with C, and contributes to the improvement in the hardness of the film. Further, in lubricating oil containing molybdenum as an additive component, the additive component is adsorbed to TiC, and hence a molybdenum sulfide ($MoS_2$) film formed by a layered compound is formed on the film surface, thereby exhibiting the low friction. When the Ti content is equal to or larger than 6 at %, TiC is sufficiently formed, and hence this state is desirable from the viewpoint of the frictional wear characteristics. From the viewpoint of the hardness of the film, it is desirable to contain a large amount of Ti, and it is desirable that the Ti content be equal to or larger than 15 at %, 18 at %, and 20 at %. When the Ti content becomes 50 at %, the film theoretically becomes a TiC film. However, since there is a large amount of TiC, TiC also adsorbs the other additive components other than the molybdic additive in the lubricating oil. For this reason, it is difficult to form an even $MoS_2$ film, and hence this state is not desirable from the viewpoint of the reduction of the friction. For this reason, it is desirable that the Ti content do not exceed 40 at %. The more desirable upper limit of the Ti content is equal to or smaller than 35 at %, 30 at %, and 25 at %.

B improves the adhesiveness between the layers causing a problem in the film of the layered structure. Further, in the sliding of lubricating oil which does not contain molybdenum, the adsorption of additives other than the molybdic additive does not actively occur due to the presence of B. Accordingly, even in the lubricating oil which does not contain molybdenum, the low friction may be exhibited. When the B content is equal to or larger than 2 at %, the adhesiveness improvement effect may be expected, but the B content is more desirably equal to or larger than 2.5 at % and 2.8 at %. However, when B is excessively contained, the adhesiveness between the layers is degraded. Further, since B is a component which is hardly sputtered, it is difficult to add a large amount of B to the film. For this reason, it is desirable that the B content be equal to or smaller than 30 at %, 20 at %, 10 at %, and 5 at %.

Furthermore, the film may contain other semiconductors and metal components in order to apply new characteristics such as corrosion resistance and heat resistance. Specifically, Al, Mn, Mo, Si, Cr, W, V, Ni, and the like may be exemplified. Here, the addition amounts of these added components need to be regulated in the specific range smaller than 20 at % and 10 at % so as not to give an adverse influence on the frictional wear characteristics obtained by Ti and B.

Further, when the entire film is assumed as 100 at %, hydrogen (H) may be contained by 2 to 30 at % and 5 to 24 at %. The film is hardened as the H content becomes smaller, but when the H content is smaller than 2 at %, the adhesiveness between the film and the substrate and the toughness of the film are degraded. For this reason, it is desirable that the H content be equal to or larger than 5 at % and 7 at %. When the H content exceeds 30 at %, the hardness of the film becomes soft, and hence the wear resistance is degraded. For this reason, it is desirable that the H content be equal to or smaller than 24 at % and 20 at %.

Further, the film may contain oxygen (O) as inevitable impurities other than the reforming component. It is desirable to regulate the O content in the range smaller than 3 at % and 1 at % when the entire film is assumed as 100 at %. When a large amount of oxygen is added, there is a concern that the network structure of the film may be collapsed. As a result, the hardness of the film decreases and hence the wear resistance is degraded.

<Lubricating Oil>

The sliding member of the present invention is used in a wet condition that uses lubricating oil. The lubricating oil contains molybdenum (Mo), sulfur (S), phosphorus (P), zinc (Zn), calcium (Ca), magnesium (Mg), natrium (Na), barium (Ba), and copper (Cu). These components are contained in the additive added to base oil. As principal additives, an alkaline-earth metal-based additive such as Ca-sulfonate, Mg-sulfonate, Ba-sulfonate, and a Na-sulfonate and an extreme-pressure additive such as phosphoric ester, phosphite ester, molybdenum dialkyldithiocarbamate (Mo-DTC), and zinc dialkyldithiophosphate (Zn-DTP) may be exemplified. Further, an additive which does not contain the above-described components may be contained like ashless dispersant such as succinimide and succinic acid ester. The lubricating oil may be supplied to at least the sliding surface when the sliding member of the present invention causes a sliding action.

Specifically, the lubricating oil may be general lubricant which contains at least one kind of S, P, Zn, Ca, Mg, Na, Ba, and Cu by 300 ppm (0.03 mass %) or more in total when the entire lubricant is assumed as 100 mass %.

Furthermore, these components are added to the base oil in the form of a compound, but in the present specification, the content of the substrate is set as the amount converted into the respective components when the entire lubricating oil is assumed as 100 mass %. The base oil may be vegetable oil, mineral oil, or synthetic oil which is generally used. Further, in the specification, Mo-based lubricating oil containing molybdenum contains Mo of 100 ppm or more when the entire lubricating oil is assumed as 100 mass %. However, the sliding member of the present invention exhibits the low friction and the high wear resistance in lubricating oil of which the Mo content is smaller than 100 ppm when the entire lubricating oil is assumed as 100 mass %. It is desirable that non-Mo-based lubricating oil which does not contain molybdenum do not contain any Mo in the lubricating oil (0 ppm), but Mo of 10 ppm or less is permitted as inevitable impurities when the entire lubricating oil is assumed as 100 mass %.

Furthermore, the upper limit of the content of the component contained in the lubricating oil is not particularly limited, but may be equal to that of the general lubricating oil. For example, the upper limit of at least one kind of Mo, S, P, Zn, Ca, Mg, Na, Ba, and Cu in total is 30,000 ppm (3 mass %) or less.

Specifically, as the lubricating oil, ATF (automatic transmission oil), CVTF (continuously variable transmission oil), driving system oil such as gear oil, fuel oil such as gasoline and light oil, engine oil, and the like may be exemplified. These kinds of lubricating oil may be used in response to the application of the sliding member of the present invention.

Furthermore, the sliding member of the present invention may be understood as the sliding method characterized in that the sliding member slides on the above-described counter material in the lubricating oil.

<Method of Manufacturing Sliding Member>

The above-described film forming method is not particularly limited, and the film may be formed by various film forming methods. For example, a physical vapor deposition method (PVD method) and a chemical vapor deposition method (CVD method) may be exemplified. Specifically, a vacuum deposition method, a sputtering method, an unbalanced magnetron sputtering (UBMS) method, an arc ion plating (AIP) method, a molecular beam epitaxy (MBE) method, a thermal CVD method, a plasma CVD method, and a method obtained by combining two or more film forming methods may be exemplified.

For example, the UBMS method may strengthen an ion injection to a workpiece (substrate) by intentionally collapsing a balance of a magnetic field applied to a target. For this reason, the ionization of a raw gas is easily promoted by electrons trapped by magnetic field lines extending from the vicinity of the target evaporation surface to the vicinity of the substrate and a reaction is easily performed. In addition, since many ions are incident to the substrate, the film may be densely and efficiently formed.

When manufacturing the sliding member of the present invention by the UBMS method, at least the Ti containing target and the B containing target are used. If necessary, the C containing target and the targets containing the raw material of the intermediate layer may be used. Furthermore, in the Ti containing target, the B containing target, and the C containing target, one target may serve as another target. As specific examples, various targets containing pure Ti, pure B, TiC, TiB, $B_4C$, and TiBC may be exemplified. These targets may be disposed inside the same reaction vessel. Further, as the treatment gas, a rare gas as a sputtering gas and a C containing gas as a reaction gas are introduced into the reaction vessel.

As the sputtering gas, one kind or more selected from the rare gases may be used. For example, an argon (Ar) gas, a xenon (Xe) gas, a helium (He) gas, a nitrogen ($N_2$) gas, and the like may be exemplified. As the C containing gas, a hydrocarbon gas and the like may be used. For example, one kind or more of methane ($CH_4$), acetylene ($C_2H_2$), and benzene ($C_6H_6$) may be used. By appropriately adjusting the treatment gas pressure and the flow amount ratio between the sputtering gas and the C containing gas, the ratio of C, Ti, and B contained in the film may be appropriately adjusted.

As described above, it is desirable that the film provided in the sliding member of the present invention contain TiC. The formation of TiC is influenced by the film forming temperature. In general, the surface temperature of the substrate increases by the sputtering energy, but when the film forming temperature is set to be equal to or larger than 150° C. and 250 to 350° C., the hard film containing TiC may be easily obtained. Furthermore, the film forming temperature is the surface temperature of the substrate during the film formation, and may be measured by a thermocouple or a radiation thermometer.

The method of driving the respective targets is not particularly limited, and any one of a direct current, an alternate current, a high frequency, a pulse wave, and the like may be used. It is desirable to appropriately adjust the power applied to the target in response to the contents of Ti and B contained in the film. Specifically, power in the range of 0 kW to 5.0 kW may be used. By changing the power applied to the target, it is possible to form the first layer and the second layer or the Ti—B—C layer having a desired composition. Further, the magnetic field intensity of the target surface may be equal to or larger than 0.1 mT and 0.2 mT to 2.0 mT.

Further, the hardness of the formed film is influenced by the bias voltage of the substrate for defining the incident energy of ion to the substrate. Since the bias voltage is applied to the substrate, hard TiC may be easily formed. In addition, the amorphous carbon is also densely settled on the substrate surface, and hence the hardness of the film is improved (for example, 18 GPa or more). When the film is formed by applying a negative bias voltage equal to or larger than 5 V and smaller than 500 V to the substrate, the ion implantation effect by UBMS is exhibited. Meanwhile, when the film is formed by applying a negative bias voltage equal to or larger than 500 V and equal to or smaller than 1200 V to the substrate, the C containing gas causes a decomposition reaction in the substrate surface, and hence the amorphous carbon film may be formed according to a plasma CVD method. Accordingly, when forming the film on the substrate, it is optimal to apply a negative bias voltage to the substrate in the range equal to or larger than 500 V and equal to or smaller than 1200 V for the formation of the first layer and in the range equal to or larger than 5 V and smaller than 500 V for the formation of the second layer.

So far, the method of manufacturing the sliding member of the present invention according to the UBMS method has been described, but the film forming method is not particularly limited as long as the method may be used for forming the film with the above-described preferable structure as the sliding member of the present invention.

In the specification, various techniques are disclosed as described above, but main techniques among them will be described below.

According to an aspect of the present invention, there is provided a sliding member including: a substrate which has a sliding surface sliding under the presence of lubricating oil and a film which is fixed to at least a part of the sliding surface, wherein the film contains carbon (C), titanium (Ti), and boron (B), is obtained by repeatedly and alternately layering a first layer containing amorphous carbon as a principal component and a second layer containing C and Ti as principal components, and has hardness of 18 GPa or more.

According to such a configuration, it is possible to obtain the sliding member that exhibits low friction and high wear resistance under a wet condition using lubricating oil.

Moreover, in the sliding member, the second layer may contain titanium carbide (TiC). Further, in the sliding member, the second layer may contain C, Ti, and B, and may include a Ti—B—C layer which is formed on at least one side of boundary face portions between the second layer and the first layer so as to have a B content higher than those of the other portions. By such a configuration, it is possible to further reliably obtain the effect of the present invention.

Further, in the sliding member, a thickness of the Ti—B—C layer may be 1 to 10 nm. By such a configuration, it is possible to satisfactorily obtain the film toughness improvement effect and to expect great improvement in the adhesiveness between the first layer and the second layer.

Moreover, in the sliding member, a ratio (T=T1/T2) of a thickness T1 of the first layer with respect to a thickness T2 of the second layer may be equal to or larger than 0.3 and equal to or smaller than 2. According to such a configuration, it is possible to satisfactorily obtain the friction reduction effect by the first layer and to satisfactorily obtain the wear resistance improvement effect by the second layer.

Further, in the sliding member, a thickness of a layered portion including a pair of the first layer and the second layer in the film may be 10 to 60 nm, and the first layer and the second layer may be layered as many as 10 to 1000 layers in total. By such a configuration, it is possible to satisfactorily obtain the film toughness improvement effect and to expect great improvement in the adhesiveness between the first layer and the second layer.

Moreover, in the sliding member, the substrate may include an intermediate layer containing chrome (Cr) on a surface to which the film is fixed.

Further, in the sliding member, when the entire film is assumed as 100 at %, the film may contain Ti of 6 at % to 40 at % and B of 2 at % to 30 at %. Thus, the low friction and the high wear resistance of the sliding member are further reliably improved, and hence the adhesiveness between the layers is also improved.

According to another aspect of the present invention, there is provided a method of using the sliding member, wherein engine oil is used as the lubricating oil. By such a configuration, it is possible to use the sliding member so as to exhibit low friction and high wear resistance under a wet condition using lubricating oil.

Further, in the above-described usage method, when the entire lubricating oil is assumed as 100 mass %, at least one kind of sulfur (S), phosphorus (P), zinc (Zn), calcium (Ca), magnesium (Mg), natrium (Na), barium (Ba), and copper (Cu) in total may be contained in the lubricating oil by 300 ppm or more. Accordingly, it is possible to further reliably obtain the effect of the present invention.

Moreover, when the entire lubricating oil is assumed as 100 mass %, molybdenum (Mo) may be contained in the lubricating oil by 100 ppm or more. Alternatively, when the entire lubricating oil is assumed as 100 mass %, a molybdenum (Mo) content may be 10 ppm or less. In any case, it is possible to use the sliding member so as to exhibit low friction and high wear resistance.

While the embodiment of the sliding member of the present invention has been described, the present invention is not limited to the above-described embodiment. Various modifications and improvements may be made by the person skilled in the art without departing from the spirit of the present invention.

EXAMPLE

Hereinafter, the present invention will be described in detail by referring to Example of the sliding member of the present invention.

Based on the embodiment, the sliding members of Example and Comparative Example were manufactured by forming various films on the surface of the substrate. Then, the evaluation of the observation of the structure of the film, the analysis of the composition of the film, and the frictional wear characteristics was performed for the respective sliding members. The method of manufacturing the sliding member will be described.

<Substrate>

A substrate made of steel (martensitic stainless steel: SUS440C) was prepared. The substrate has a dimension: 6.3 mm×15.7 mm×10.1 mm, surface hardness: Hv650, and surface roughness: 0.011 µm (0.1 µm in mean roughness (Rz) of 10 points specified by JIS) in Ra.

<Manufacturing of Sliding Member>

Various films were formed on the surface of the substrate by using an unbalanced magnetron sputtering device (UBMS504 manufactured by Kobe Steel, Ltd.). The schematic diagram of the device is shown in FIG. 2. A device 20 includes a vessel 21, a base 22 which rotatably holds a plurality of substrates S by the center portion of the vessel 21, and four magnetrons 23 which are disposed around the base 22 and may place a target thereon.

The vessel 21 is formed in a cylindrical shape, and includes two gas introduction pipes 21a which are formed at the upper portion thereof and a gas delivery pipe 21b which is formed at the lower portion thereof. Two gas introduction pipes 21a are respectively connected to various gas cylinders (not shown) through a valve (not shown). The gas delivery pipe 21b is connected to a turbo-molecular pump (not shown) and a rotary pump (not shown) through a valve (not shown). Further, four magnetrons 23 are disposed on the inner wall of the vessel 21 at the same interval in the circumferential direction.

The base 22 is connected to a DC pulse power supply, and a bias voltage is applied to the substrate S if necessary. The base 22 rotates at the center of the vessel 21, and the respective jigs holding the substrate S also rotate. For this reason, it is possible to evenly form a film on the surfaces of all substrates S held by the base 22.

Among three of four magnetrons 23 attached to the device 20, a pure titanium (Ti) target, a boron carbide ($B_4C$) target used as a B supply source, and a pure chrome (Cr) target used to form the intermediate layer are respectively placed on the front sides of three magnetrons. Power may be independently applied to the targets.

When manufacturing a sample, the plurality of substrates S were held by the base 22. The surfaces of the respective targets and the film forming surfaces of the substrates S face one another by rotating the base 22 during the film forming process. At this time, the short distance from the surface of the substrate to the surface of the target was 150 mm.

<<Formation of Intermediate Layer>>

First, the exhaust of the vessel 21 was performed by $3 \times 10^{-3}$ Pa. Next, the gas pressure inside the vessel was set to 0.4 Pa by introducing an argon (Ar) gas from the gas introduction pipe 21a. 3.0 kW was applied to the Cr target by a power supply device attached to the device 20 so as to sputter the Cr target by the Ar gas, and a plasma discharge was generated in the Cr target so as to form a Cr film on the surface of the substrate S. Further, a Cr—C-based film was formed on the surface of the Cr film by introducing an acetylene ($C_2H_2$) gas from the gas introduction pipe 21a. At this time, the concentration of C changes in gradient in the thickness direction so that the concentration of C becomes the highest at the film surface side of the Cr—C-based film by gradually increasing the flow rate of the acetylene gas from 0 to 15 sccm. In this way, an intermediate layer having a total thickness of about 0.6 μm was formed.

<<Formation of Film>>

After the end of the formation of the intermediate layer, the gas pressure inside the vessel was set to 0.5 Pa by introducing an Ar gas and a $C_2H_2$ gas. Next, a plasma discharge was generated in the respective targets by applying predetermined power to the Ti target and the $B_4C$ target through the power supply device attached to the device. In the meantime, a negative bias voltage was applied to the substrate S by the DC pulse power supply connected to the base 22. In Example, <Analysis of Composition of Film and Measurement of Hardness of Film>

The analysis of the film composition of the entire film and the measurement of the hardness of the film were performed for the sample obtained in this procedure. The result is shown in Table 1. The film composition was determined by an electron probe microanalysis (EPMA: an analysis with an accelerating voltage of 10 kV and an analysis surface region of 100 μm), an X-ray photoelectron spectroscopy (XPS), an Auger electron spectroscopy (AES), and a Rutherford back scattering method (RBS). The hardness of the film was calculated from a measurement value obtained by measuring the surface hardness of the sample by Nano-Indenter (MTS manufactured by TOYO Corporation). Furthermore, the remainder contains C as a principal component, and contains H (about 1 to 30 at %) and O (less than 3 at %) as inevitable impurities.

TABLE 1

| | FILM FORMING TIME | | | FILM COMPOSITION | | | HARDNESS/ |
|---|---|---|---|---|---|---|---|
| | BIAS VOLTAGE | VOLTAGE APPLICATION | METHOD | Ti/at % | B/at % | FILM STRUCTURE | GPa |
| COMPARATIVE EXAMPLE 1 | — | 120 MINUTES | CONSTANT | 0.0 | 0.0 | DLC SINGLE-LAYERED FILM | 20.3 |
| COMPARATIVE EXAMPLE 2 | 1 MINUTE | 1 MINUTE | ALTERNATE | 0.0 | 0.0 | DLC SINGLE-LAYERED FILM | 22.3 |
| COMPARATIVE EXAMPLE 3 | 1 MINUTE | 2 MINUTES | ALTERNATE | 9.4 | 0.0 | HETEROGENEOUS LAYERED FILM | 23.1 |
| COMPARATIVE EXAMPLE 4 | 0.5 MINUTES | 1.5 MINUTES | ALTERNATE | 14.1 | 1.5 | HETEROGENEOUS LAYERED FILM | 17.8 |
| EXAMPLE 1 | 0.5 MINUTES | 2 MINUTES | ALTERNATE | 23.8 | 3.0 | HETEROGENEOUS LAYERED FILM | 27.9 |
| EXAMPLE 2 | 0.5 MINUTES | 2 MINUTES | ALTERNATE | 21.6 | 4.7 | HETEROGENEOUS LAYERED FILM | 20.8 |
| EXAMPLE 3 | 0.5 MINUTES | 2 MINUTES | ALTERNATE | 22.4 | 4.0 | HETEROGENEOUS LAYERED FILM | 20.8 | first, the first layer was formed by applying a bias voltage of 1000 V for a predetermined time. Next, the second layer was formed by changing the bias voltage applied to the substrate S from 1000 V to 100 V. Another first layer was formed on the surface of the second layer by changing the bias voltage applied to the substrate S to 1000 V again after a predetermined time. By changing the intermittent bias voltage plural times, a layered film having a thickness of 1.5 to 3 μm was formed by repeatedly and alternately layering the first layer and the second layer on the surface of the intermediate layer.

Specifically, seven kinds of samples (sliding members) were obtained by alternately changing the bias voltage according to the film forming time shown in Table 1. The amounts of Ti and B contained in the film and the thickness of the Ti—B—C layer were changed by adjusting the power applied to the target in the range of 0 to 5.0 kW along with the change of the bias voltage. The surface temperature of the substrate S during the film forming process was 300° C. in any case.

Furthermore, Comparative Example 1 is a sample which has a single-layered amorphous carbon film (DLC single-layered film) without a layered structure. The DLC single-layered film was formed with the bias voltage of 100 V by causing a plasma discharge of the pure C target placed on the magnetron 23 inside the vessel 21 into which an Ar gas and a methane gas were simultaneously introduced.

<Evaluation of Frictional Wear Characteristics>

A ring-on-block test was performed by using the sample obtained according to the above-described procedure as a block test piece. FIG. 3 illustrates a schematic diagram of a ring-on-block type friction testing machine (LFW-1 manufactured by FALEX corporation). As shown in FIG. 3, a ring-on-block type friction testing machine 30 includes a block test piece 31 and a ring test piece 32 as a counter material. The block test piece 31 and the ring test piece 32 are provided while a film 31f formed in the block test piece 31 abuts against the ring test piece 32. The ring test piece 32 is rotatably provided in an oil bath 33. In this test, as the ring test piece 32, an S-10 ring test piece (material: steel carburizing material of SAE4620, shape: φ35 mm, width 8.8 mm, and surface roughness: 1.3 μm in Rz, FALEX corporation) as a standard test piece of the friction testing machine 30 was used. Further, a molybdic additive containing engine oil (Mo-based engine oil, viscosity grade: 0W-20) maintained at 80° C. was used in the oil bath 33. The Mo-based engine oil contains Mo-DTP, Mo-DTC, and the like as an additive, and it is found that the engine oil contains Mo of 0.01 mass % (100 ppm) or more and components (Specifically, Ca, Zn, S, and P) other than Mo of 0.05 mass % (500 ppm) from the formulation data of lubricant manufacturers and the analysis of metal components in the oil when the engine oil is assumed as 100 mass %.

In the friction test, first, the ring test piece 32 was rotated in a non-load state. Subsequently, the ring test piece 32 slid on the block test piece 31 at the sliding speed of 0.3 m/s by applying 300 N of a load (hertz surface pressure of 310 MPa) from the surface of the block test piece 31. Here, the hertz surface pressure indicates the maximum value of the actual surface pressure in consideration of the elastic deformation of the contact portion between the block test piece 31 and the ring test piece 32. After the sliding action for 30 minutes, the frictional wear characteristics were measured. The measured frictional wear characteristics include the frictional coefficient between the block test piece 31 and the ring test piece 32 and the maximum wear depth of the respective block test pieces 31. The measurement result is shown in Table 2.

Figure 6:
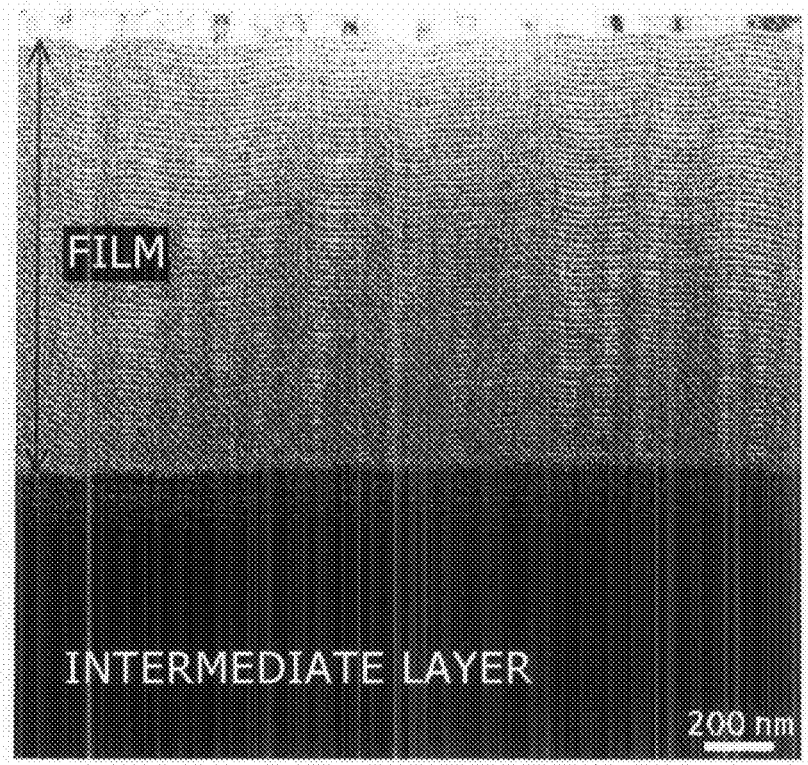
FIG. 6 illustrates a cross-section observation result of the film provided in the sliding member of the present invention.
Figure 7:
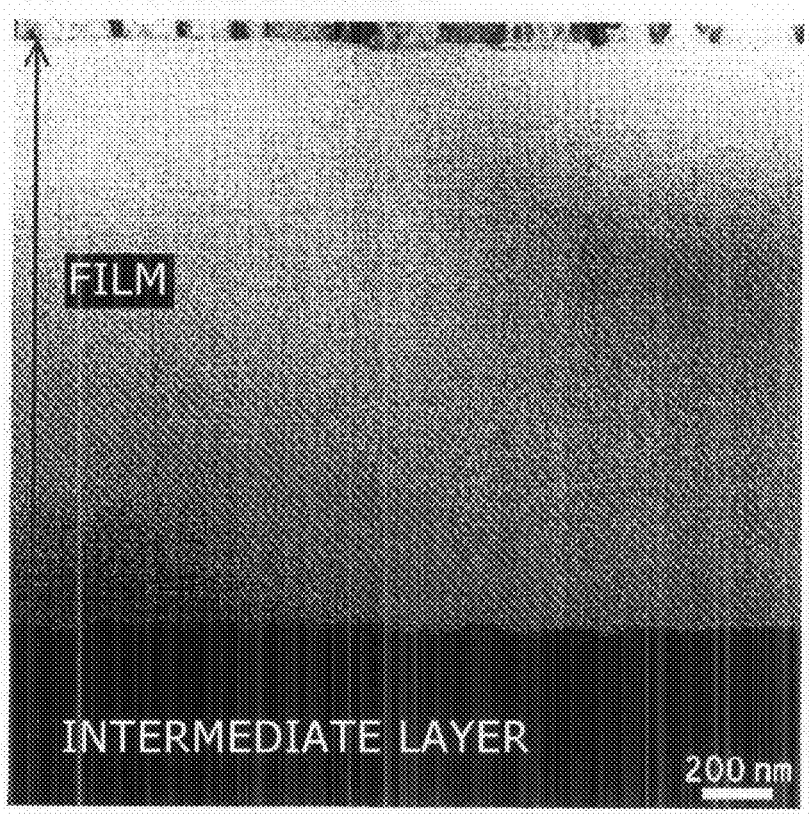
FIG. 7 illustrates a cross-section observation result of a film provided in a sliding member of the related art.

Furthermore, a ring-on-block test was performed on the samples manufactured by Example 3 and Comparative Example 1 as described above by using non-Mo-based engine oil I or non-Mo-based engine oil II (viscosity grade: 0W-20) substantially without Mo of which a molybdic additive content is smaller than that of the Mo-based engine oil instead of the Mo-based engine oil. The result is shown in Table 3 and FIG. 5. The result of only the "substrate" shown in Table 3 is a result in which a ring-on-block test was performed on the substrate (SUS440C) without the intermediate layer and the film.

from the samples of Example 1 and Comparative Example 2, and the observation result obtained by TEM is shown in FIGS. 6 and 7. Furthermore, the tissue (the upper side of the picture in FIGS. 6 and 7) seen from the surface of the film is an aluminum protection film which is formed to manufacture the thin sample.

In the observation result (FIG. 6) of the sample of Example 1, a layered structure obtained by layering two kinds of layers which may be clearly distinguished by the contrasting was found in the film. According to the limited field diffraction image (not shown), the diffraction pattern from the bright layer was a halo pattern of amorphous carbon. Further, the diffraction pattern from the dark layer indicates the presence of fine crystals of TiC of about 5 nm. That is, it is found that the sample of Example 1 includes a heterogeneous layered film with a layered structure obtained by repeatedly and alternately layering two different kinds of layers, that is, a first layer containing amorphous carbon and a second layer containing TiC. Furthermore, in Examples 1 to 3, the film is formed according to the same procedure differently from the change of the voltage applied to the target. For this reason, it is apparent that the films of Examples 2 and 3 are heterogeneous layered films obtained by the first layer and the second layer.

TABLE 2

| | FILM COMPOSITION | | HARDNESS/ | FRICTIONAL | WEAR DEPTH/ | |
|---|---|---|---|---|---|---|
| | Ti/at % | B/at % | GPa | COEFFICIENT | μm | FILM STRUCTURE |
| COMPARATIVE EXAMPLE 1 | 0.0 | 0.0 | 20.3 | 0.066 | 0.646 | DLC SINGLE-LAYERED FILM |
| COMPARATIVE EXAMPLE 2 | 0.0 | 0.0 | 22.3 | 0.079 | 1.231 | DLC SINGLE-LAYERED FILM |
| COMPARATIVE EXAMPLE 3 | 9.4 | 0.0 | 23.1 | 0.051 | 0.952 | HETEROGENEOUS LAYERED FILM |
| COMPARATIVE EXAMPLE 4 | 14.1 | 1.5 | 17.8 | 0.078 | 0.789 | HETEROGENEOUS LAYERED FILM |
| EXAMPLE 1 | 23.8 | 3.0 | 27.9 | 0.056 | 0.225 | HETEROGENEOUS LAYERED FILM |
| EXAMPLE 2 | 21.6 | 4.7 | 20.8 | 0.053 | 0.186 | HETEROGENEOUS LAYERED FILM |
| EXAMPLE 3 | 22.4 | 4.0 | 20.8 | 0.052 | 0.115 | HETEROGENEOUS LAYERED FILM |

TABLE 3

| | | Mo-BASED ENGINE OIL | NON-Mo-BASED ENGINE OIL | |
|---|---|---|---|---|
| | | | I | II |
| EXAMPLE 3 (HETEROGENEOUS LAYERED FILM) | FRICTIONAL COEFFICIENT μ | 0.052 | 0.072 | 0.106 |
| | WEAR AMOUNT/μm | 0.115 | 0.265 | 0.133 |
| ONLY SUBSTRATE (SUS440C) | FRICTIONAL COEFFICIENT μ | 0.073 | 0.071 | 0.116 |
| | WEAR AMOUNT/μm | 0.822 | 0.843 | 0.255 |
| COMPARATIVE EXAMPLE 1 (DLC SINGLE-LAYERED FILM) | FRICTIONAL COEFFICIENT μ | 0.066 | 0.116 | 0.125 |
| | WEAR AMOUNT/μm | 0.572 | 0.104 | 0.080 |

<Observation of Cross-Section of Film>

In order to check that the film formed in Examples is a layered structure, the cross-section of the film was observed by using a transmission electron microscope (TEM). A thin sample for observing the cross-section was manufactured Meanwhile, in the observation result (FIG. 7) of the sample of Comparative Example 2, a stripe pattern was observed in the film, but the presence of the dark layer was not found. Then, according to a limited field diffraction image (not shown), a diffraction pattern representing a halo pattern of amorphous carbon was obtained at any position of the film. Accordingly, it is found that the sample of Comparative Example 2 includes a film in which the entire film is formed of amorphous carbon and a layered structure is obtained by layering a plurality of homogenous layers.

Further, the analysis of the composition of the film was performed for Example 1 by using an energy dispersive X-ray analysis (EDX). FIG. 8 illustrates a HAADF image according to a high angle scattering ring dark field scanning transmission microscope method (HAADF-STEM method) and a concentration profile according to the TEM-EDX analysis. In the concentration profile, the analysis direction and the positions 1 to 4 of the HAADF image are shown. Furthermore, the contrast of the HAADF image is opposite to the contrast of the bright field image (for example, FIGS. 6, 7, 10, and 11).

The position 1 is positioned at the darkest layer (that is, the first layer containing amorphous carbon) in the HAADF image, and it is found that C is mainly contained in the vicinity thereof and a slight amount of Ti and a slight amount of B are further contained according to the EDX analysis. The position 3 is positioned at the brightest layer (that is, the second layer containing a large amount of Ti) in the HAADF image, and it is found that C and Ti are contained in the vicinity thereof by the substantially same amount and a slight amount of B is contained according to the EDX analysis. The position 2 and the position 4 are positioned at the vicinity of the boundary between the first layer and the second layer, and it is found that C and Ti are contained at any one of the points along with a slight amount of B according to the EDX analysis. However, a large amount of B was detected in the vicinity of the position 2 compared to the vicinity of the position 4. That is, it is found that B has a concentration gradient in which the concentration becomes higher at the film surface side in relation to the substrate side in the thickness direction of the second layer. In particular, it is found that the Ti—B—C layer having a large amount of B is formed at the portion positioned at the film surface side in the second layer.

Figure 9:
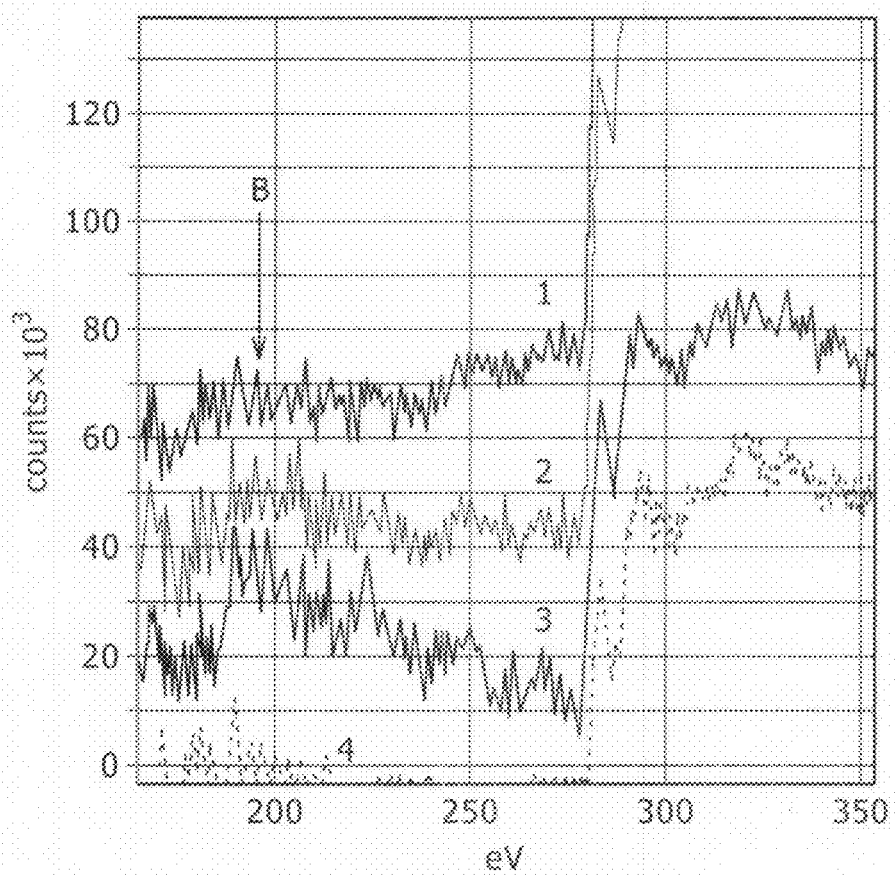
FIG. 9 illustrates a line analysis result based on TEM-EELS in the film provided in the sliding member of the present invention.
Figure 10:
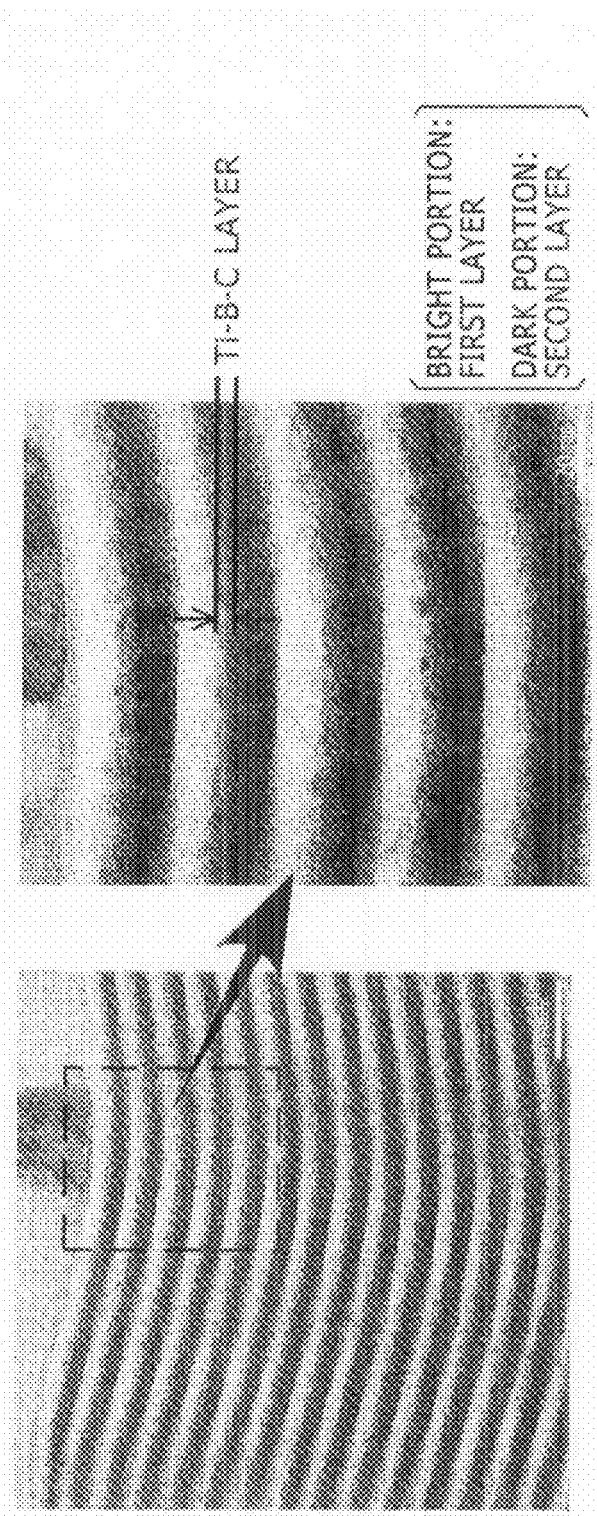
FIG. 10 illustrates a cross-section observation result of the film provided in the sliding member of the present invention.

Next, the film thicknesses of the first layer and the second layer were measured for Example 1. Further, the film thickness of the Ti—B—C layer having a large amount of B in the second layer was also measured for the second layer. The measurement of the film thickness was performed by actually measuring a plurality of positions on the TEM picture based on an EDX analysis result. For example, FIG. 10 is a result obtained by observing the cross-section of the thin sample of Example 1 with a high magnification by TEM. One boundary between the first layer and the second layer may be clearly determined by the boundary of the bright layer and the dark layer of FIG. 10. Since the other boundary between the first layer and the second layer is not clearly determined only by the TEM image due to the presence of the Ti—B—C layer, the other boundary is defined from an electron energy loss spectroscopic process (EELS, FIG. 9) combined with TEM and a concentration profile (FIG. 8) of an EDX analysis. That is, even in the concentration profile of the EDX analysis and the line analysis based on TEM-EELS, the range in which the B spectrum is clearly detected was measured as the Ti—B—C layer. The numerals 1 to 4 of FIG. 9 respectively correspond to the positions 1 to 4 described in FIG. 8. For example, from the EELS line analysis of FIG. 9, B was detected at the position 3, but B was not detected at the position 2. That is, in Example, the Ti—B—C layer corresponds to a region (B detection region shown in FIG. 8) in which the counted number of B (the vertical axis) is $30 \times 10^4$ or more in the concentration profile of the EDX analysis. The measurement result of the film thickness is shown in Table 4 and Table 5. Furthermore, in Table 4, "T1" indicates the thickness of the first layer, and "T2" indicates the thickness of the second layer (where the unit is nm). Then, a ratio "T1/T2" of T1 with respect to T2 indicates the layered film thickness ratio.

The same measurement was performed for the sample of Comparative Example 4. The result obtained by observing the cross-section of the thin sample of Comparative Example 4 with a high magnification by TEM is shown in FIG. 11, and the measurement result of the film thickness is shown in Table 4. Further, in the method of manufacturing the sample of Comparative Example 3, a film was formed by applying predetermined power to a $B_4C$ target, and hence Comparative Example 3' was made by adding a slight amount of B to the film. Then, as described above, the thickness of the Ti—B—C layer was measured. The result is shown in Table 5.

TABLE 4

| | FILM COMPOSITION | | HARDNESS/ | FRICTIONAL | WEAR DEPTH/ | LAYERED FILM THICKNESS RATIO |
|---|---|---|---|---|---|---|
| | Ti/at % | B/at % | GPa | COEFFICIENT | μm | (T1/T2) |
| COMPARATIVE EXAMPLE 4 | 14.1 | 1.5 | 17.8 | 0.078 | 0.789 | 2.86 (20/7) |
| EXAMPLE 1 | 23.8 | 3.0 | 27.9 | 0.056 | 0.225 | 0.67 (10/15) |

TABLE 5

| | FILM COMPOSITION | | HARDNESS/ | FRICTIONAL | WEAR DEPTH/ | Ti—B—C LAYER THICKNESS/ |
|---|---|---|---|---|---|---|
| | Ti/at % | B/at % | GPa | COEFFICIENT | μm | nm |
| COMPARATIVE EXAMPLE 3 | 9.4 | 0.0 | 23.1 | 0.051 | 0.952 | 0.0 |
| COMPARATIVE EXAMPLE 3' | 9.0 | 1.3 | 13.7 | 0.054 | 0.821 | 0.4 |
| EXAMPLE 1 | 23.8 | 3.0 | 27.9 | 0.056 | 0.225 | 5.0 |

The sample of Comparative Example 1 includes a single-layered DLC film. The sample of Comparative Example 2 includes a film which is a DLC film with a layered structure, and the structure is formed by layering two kinds of DLC layers in which different bias voltages are applied to the substrate during the film forming process. That is, since the sample of Comparative Example 2 includes the DLC film with a highly dense DLC layer formed by applying a high bias voltage thereto, the surface hardness is higher than that of the sample of Comparative Example 1. However, there is not a big difference between both frictional coefficients. With regard to the wear depth, the layered structure is formed in Comparative Example 2 and the film is provided with a plurality of boundary faces. As a result, the toughness of the film is degraded due to the influence of the boundary face, and hence the wear resistance is also influenced.

In the sample of Comparative Example 3 including the film having the second layer that contains Ti but does not contain B, the friction is lower than those of the samples of Comparative Examples 1 and 2 and the surface hardness is improved. However, the wear resistance is low. It is considered that the improvement in hardness of Comparative Example 3 depends on the formation of TiC when applying a low bias voltage to the substrate, but it is found that the improvement in wear resistance may not be expected only by the improvement in hardness due to TiC.

The samples of Comparative Example 4 and Examples 1 to 3 include a film which contains C as a principal component and contains Ti and B. In the samples of Examples 1 to 3, low friction is exhibited compared to the sample of Comparative Example 1 including the DLC single-layered film in the frictional coefficient, and the wear resistance is greatly improved compared to any of Comparative Examples in the wear depth.

The improvement in the surface hardness of the samples of Examples 1 to 3 is caused by the film which includes the second layer containing TiC as a super-hard compound. It is considered that TiC is formed due to Ti contained in the film and the surface hardness is improved. However, the reason why the hardness of the film of Comparative Example 4 is extremely low is because the thickness (T1) of the first layer containing amorphous carbon exceeds two times the thickness (T2) of the second layer containing TiC. That is, in order to obtain the hard film, it is effective to sufficiently form the second layer so that the ratio of T1/T2 becomes 2 or less and particularly desirably 1 or less. Then, the wear resistance is also greatly improved.

Further, since the samples of Comparative Example 4 and Examples 1 to 3 contain B along with Ti, the wear resistance is improved. This is because the adhesiveness of the boundary face between the first layer and the second layer is improved due to the presence of B and the toughness of the film is improved. Furthermore, in the sample of Comparative Example 3, it is found that a crack occurs in the film surface after the frictional wear test and the crack is caused by the separation from the boundary face. In particular, when the B content is equal to or larger than 3 at %, it is found that a thickness is formed in which the Ti—B—C layer sufficiently exhibits in the second layer and the wear resistance is greatly improved.

A decrease in the frictional coefficient is largely influenced by Ti contained in the film as understood from the frictional wear test result of Comparative Example 3. Under the presence of Mo-based engine oil, the friction reduction mechanism exhibits low friction in a manner such that a Mo-based additive derived component is adsorbed to the film surface and a $MoS_2$ film formed of a layered compound is formed on the sliding surface as a boundary film. Since the Mo-based additive derived component is easily adsorbed to carbide, the samples of Examples including the film with the second layer containing TiC exhibit excellent frictional wear characteristics in the Mo-based engine oil.

Furthermore, even in the sliding member including a TiC film (single layer) as a film, a Mo-based additive derived component is adsorbed to the surface of the TiC film due to the sliding action under the presence of Mo-based engine oil. However, it is understood that another additive derived component contained in Mo-based engine oil is also adsorbed to the surface of the TiC film. As a result, since a film containing Ca, Zn, P, and the like is formed instead of the $MoS_2$ film in which the boundary film formed on the sliding surface is uniform, it is considered that the exhibition of the low friction characteristics is difficult. In Examples, since the film is formed as the layered structure with the first layer containing amorphous carbon and the second layer containing TiC, it is supposed that the low friction is caused by the presence of an appropriate amount of Tic in the sliding surface.

From the description above, it is understood that it is important to contain C as a principal component along with Ti and B and to have the layered structure with the first layer containing amorphous carbon and the second layer containing TiC for the improvement in the frictional wear characteristics of the sliding member.

Figure 5:
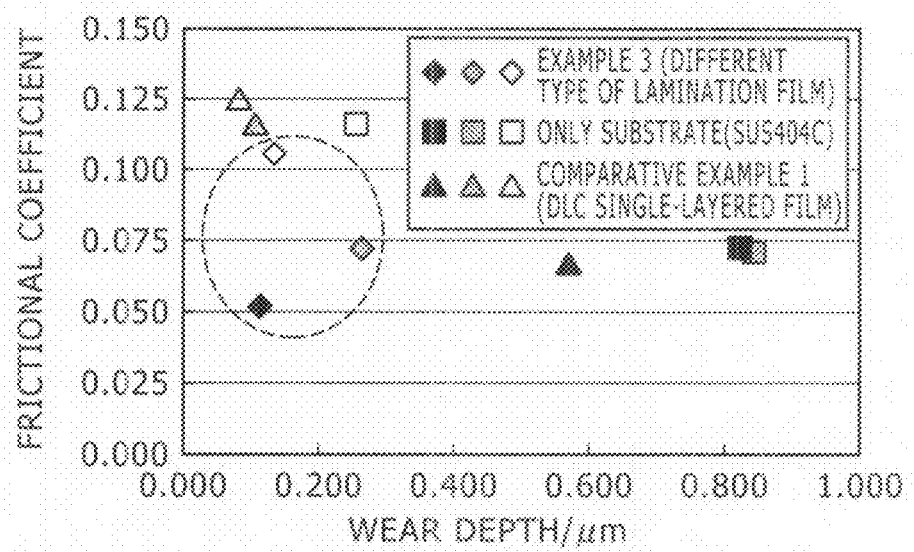
FIG. 5 is a graph illustrating a result of a friction test performed by using a different type of lubricating oils and illustrates frictional coefficients and wear depths of various sliding members.

Moreover, it is understood that the sliding member of Example 3 exhibits low friction and high wear resistance regardless of the type of engine oil. FIG. 5 is a graph illustrating the frictional wear test result of the sliding member of Example 3 and the sliding member and the substrate (SUS404C) of Comparative Example 1, and is a result obtained by performing a test in two different kinds of non-Mo-based engine oils in addition to Mo-based engine oil. In the substrate and the sliding member of Comparative Example 1, the wear resistance in Mo-based engine oil was low. Meanwhile, it is found that the frictional coefficient increases even though the wear resistance is improved in the non-Mo-based engine oil. As described above, the sliding member of Example 3 exhibits low friction and high wear resistance in the Mo-based engine oil. Then, it is found that the frictional wear characteristics of the sliding member of Example 3 are largely decreased in the non-Mo-based engine oil. It is supposed that this result is caused because the boundary film promoting the low friction is formed by the interaction of Ti and B with respect to various additives in engine oil due to the film containing Ti and B in addition to the improvement in the wear resistance according to the layered structure of the film. That is, it is found that the sliding member of the present invention may sufficiently exhibit low friction and high wear resistance even when lubricant containing Mo and lubricant containing a small Mo content are used.

Priority is claimed on Japanese Patent Application No. 2011-091450, filed on Apr. 15, 2011, the content of which is incorporated herein by reference.

In order to express the present invention, the present invention has been appropriately and sufficiently described through the embodiment by referring to the drawings as described above, but it should be noted that the above-described embodiment may be easily modified and/or improved by the person skilled in the art. Accordingly, it is understood that the modification or the improvement is included in the scope of claims as long as the modification or the improvement conducted by the person skilled in the art does not deviate from the scope of claims.

Industrial Applicability

The present invention has broad industrial applicability in the technical field of a sliding member that is mainly used under a wet condition using lubricating oil.

The invention claimed is:
1. A sliding member, comprising:
    a substrate which comprises a sliding surface sliding under the presence of lubricating oil; and
    a film which is fixed to at least a part of the sliding surface, wherein
    the film has a hardness of 18 GPa or more,
    the film comprises carbon (C), titanium (Ti), and boron (B),
    the film is obtained by repeatedly and alternately layering
        a first layer comprising amorphous C as a principal component and a second layer comprising C and Ti as principal components, and the second layer further comprises B and a Ti—B—C layer which is formed on at least one side of boundary face portions between the second layer and the first layer so as to have a B content higher than B contents of the other portions.

2. The sliding member according to claim 1,
wherein the second layer comprises titanium carbide (TiC).

3. The sliding member according to claim 1,
wherein the Ti—B—C layer has a thickness of from 1 to 10 nm.

4. The sliding member according to claim 1,
which has a ratio (T=T1/T2) of a thickness T1 of the first layer with respect to a thickness T2 of the second layer of from 0.3 to 2.

5. The sliding member according to claim 1, wherein
a layered portion of a pair of the first layer and the second layer in the film has a thickness of from 10 to 60 nm, and
a total number of layers of the first layer and the second layer ranges from 10 to 1000.

6. The sliding member according to claim 1,
wherein the substrate further comprises an intermediate layer comprising chrome (Cr) on a surface to which the film is fixed.

7. The sliding member according to claim 1,
wherein the film contains Ti of from 6 at % to 40 at % and B of from 2 at % to 30 at %, based on a total atomic amount of the entire film.

\* \* \* \* \*